United States Patent [19]
Okamoto

[11] Patent Number: 5,773,339
[45] Date of Patent: Jun. 30, 1998

[54] METHOD OF MAKING DIFFUSED LAYER RESISTORS FOR SEMICONDUCTOR DEVICES

[75] Inventor: Yutaka Okamoto, Tokyo, Japan

[73] Assignee: Sony Corporation, Tokyo, Japan

[21] Appl. No.: 534,246

[22] Filed: Sep. 26, 1995

[30] Foreign Application Priority Data

Sep. 29, 1994 [JP] Japan ..................................... 6-234813

[51] Int. Cl.⁶ ...................... H01L 21/8238; H01L 21/266
[52] U.S. Cl. .......................... 438/210; 438/238; 438/383; 438/682
[58] Field of Search ................................ 437/41 SM, 44, 437/60, 200, 57, 58, 918; 148/DIG. 136; 438/200, 210, 238, 382, 383, 682, 683; 257/379, 350, 358, 363

[56] References Cited

U.S. PATENT DOCUMENTS

| 4,316,319 | 2/1982 | Anantha et al. | 438/382 |
|---|---|---|---|
| 4,551,907 | 11/1985 | Mukai | 438/682 |
| 4,609,568 | 9/1986 | Koh et al. | 427/85 |
| 4,643,777 | 2/1987 | Meada | 148/1.5 |
| 5,126,279 | 6/1992 | Roberts | 437/52 |
| 5,134,088 | 7/1992 | Zetterlund | 438/210 |
| 5,356,826 | 10/1994 | Natsume | 148/DIG. 136 |
| 5,405,806 | 4/1995 | Pfeister et al. | 438/683 |

*Primary Examiner*—T. N. Quach
*Attorney, Agent, or Firm*—Hill & Simpson

[57] ABSTRACT

A low-concentration diffused region is created on a region of a semiconductor substrate reserved for the creation of a diffused-region resistor, and after a mask creation film has been created on the surface of the semiconductor substrate, a doping mask is created to cover part of the region reserved for the creation of a diffused-region resistor. Subsequently, a high-concentration diffused layer is created on the region reserved for the creation of a diffused-region resistor except the part covered by the doping mask by using an impurity doping technique. Then, after a silicide creating mask has been created from the mask creation film by means of an etching technique using the doping mask as an etching mask, the doping mask is removed. Later on, a silicide layer is created selectively on the high-concentration diffused layer. In addition, this method can be applied also to a method of creating a diffused layer in a CMOS process.

10 Claims, 5 Drawing Sheets

METHOD OF MAKING DIFFUSED LAYER RESISTORS FOR SEMICONDUCTOR DEVICES

BACKGROUND OF THE INVENTION

1. Field of the Invention

The present invention relates to a method of creating MOS transistors and diffused-layer resistors employed in semiconductor devices.

2. Description of Related Art

The conventional method of creating diffused-layer resistors is explained by referring to FIGS. 1A to 1C, diagrams which show CMOS processes of creating a diffused-layer resistor.

As shown in FIG. 1A, a low-concentration diffused layer 4 of a diffused-layer resistor is formed in the creation of low-concentration diffused layers 2 and 3 to be used as LDD diffused layers of a MOS transistor on a semiconductor substrate 1.

Later on, a gate and a side wall are created. Subsequently, a CVD oxide film 5 is created on the surface side of the semiconductor substrate 1 as shown in FIG. 1B. Then, by using an ion-implantation technique, high-concentration diffused layers 6 and 7 are selectively created to serve as source and drain regions of a first conduction-type MOS transistor. At the same time, a high-concentration diffused layer 8 of the diffused-layer resistor is created. Even though not shown in the figure, source and drain regions of a second conduction-type MOS transistor are also selectively created using the ion-implantation technique.

Then in order to lower the resistances of a gate lead 9 (including a gate electrode) and the high-concentration diffused layers 6 and 7 on the source and drain regions, the CVD oxide film 5 is removed as shown in FIG. 1C. Later on, by using a silicide creating process, a silicide layer 10 is created on the gate lead 9. Similarly, silicide layers 11 and 12 are created on the high-concentration diffused layers 6 and 7 of the drain and source regions respectively. At that time, a silicide layer 13 is also created on the high-concentration diffused layer 8 of the diffused-layer resistor.

By creating the silicide layers 10 to 13 as described above, the resistances of the high-concentration diffused layers 6 to 8 and the gate lead 9 can be reduced by up to several $\Omega/\square$.

With the technique of creating a diffused-layer resistor described above, a long diffused layer must be created in order to make a diffused-layer resistor composed of a high-concentration diffused layer that needs a resistance of several tens of $\Omega/\square$ or greater. For that reason, the creation region of the diffused layer is inevitably increased, making it difficult to implement the large-scale integration of the device. In particular, when building a delay circuit comprising diffused-layer resistors and capacitors, or when building a protection circuit, resistors each having a high resistance are needed, making the problem described above even more serious.

SUMMARY OF THE INVENTION

It is an object of the present invention to provide a method for creating a diffused-layer resistor having a small region but a high resistance which method requires only a small process load even if a silicide process is applied in the creation of the diffused-layer resistor.

The present invention provides a technique for creating a diffused layer resistor which technique allows the object described above to be achieved.

To describe the technique in more detail, in a first process, a low-concentration diffused layer is created on a region reserved for the creation of a diffused-layer resistor on a semiconductor substrate. In a subsequent second process, a mask creation film is created on the surface of the semiconductor substrate and, then, a doping mask is created, covering part of the region reserved for the creation of the diffused-layer resistor. Subsequently, in a third process, an impurity doping technique is used for creating a high-concentration diffused layer on the region reserved for the creation of a diffused-layer resistor except the part covered by the doping mask. In a final fourth process, a silicide creating mask is created from the mask creation film described above by using an etching technique with the doping mask used as an etching mask. After the etching process, the doping mask is removed, and a silicide layer is then selectively created on the high-concentration diffused layer.

With the technique of creating a diffused-layer resistor in a CMOS process wherein the technique of creating a diffused-layer resistor is adopted, in a first process, a gate electrode of each of first and second conduction-type MOS transistors is created through a gate insulating film. At the same time, a low-concentration layer to be used as an LDD diffused layer and a low-concentration diffused layer of the diffused-layer resistor are created. In a subsequent second process, a mask creation film is created on the surface of the semiconductor substrate. A first doping mask covering a region reserved for creating the first conduction-type MOS transistor and a region reserved for the creation of the diffused-layer resistor is further created. Subsequently, high-density diffused layers to be used as source and drain regions of the second conduction-type MOS transistor are created using the impurity doping technique. A mask creation film on the region reserved for the creation of the second conduction-type MOS transistor is then removed by an etching technique with the first doping mask used as an etching mask. After that, the first doping mask is removed. Subsequently, a second doping mask covering part of a region reserved for the creation of the diffused-layer resistor and a region reserved for creating the second conduction-type MOS transistor is created. In a following third process, an impurity doping technique is used for creating a high-concentration diffused layer on the region reserved for the creation of a diffused-layer resistor except the part covered by the second doping mask. In a final fourth process, a silicide creating mask is created from the mask creation film described above by using an etching technique with the second doping mask used as an etching mask. After the etching process, a silicide layer is then selectively created on each high-concentration diffused layer and on each gate electrode by using the silicide creating mask.

With a method of creating a diffused-layer resistor in the course of creating a diffused-layer fetching substrate, in a first process, low-concentration diffused layers are created on region reserved for the creation of the diffused-layer resistor and a region reserved for the creation of the diffused-layer fetching substrate on a semiconductor substrate. In a subsequent second process, a mask creating film and a doping mask are created in the same ways as the ones described above. Subsequently, in a third process, high-concentration layers are created on the region reserved for the creation of the diffused-layer resistor except the part covered by the doping mask and the region reserved for the creation of the diffused-layer fetching substrate by using the impurity doping technique. Finally, in a fourth process, a silicide creating process is carried out in the same way as the one described above.

In the method of creating a diffused-layer resistor described above, a doping mask covering part of the region reserved for the creation of the diffused-layer resistor is created. Accordingly, a high-concentration diffused layer is created only on part of the region reserved for the creation of the diffused-layer resistor. As a result, the diffused-layer resistor is composed of a low-concentration diffused layer and a high-concentration diffused layer, resulting a resistance thereof having a high value in comparison with the conventional one.

In addition, a silicide creating mask is created with a doping mask for creating a high-concentration layer used as an etching mask. Thus, the silicide creating mask can be created without increasing the number of mask processes.

In addition, when carrying out a silicide creating process, a silicide creating mask created in the way described above is used. Accordingly, no silicide layer is created on the low-concentration diffused layer which is covered by the silicide creating mask. Then, the upper surface of the high-concentration diffused layer undergoes a silicide creating process. Thus, in the case of this diffused-layer resistor, the silicide layer is created only on the high-concentration diffused layer. As a result, since the silicide layer is created not on all surfaces of the diffused-layer resistor, the resistance of diffused-layer resistor is not decreased by the silicide layer.

In the technique of creating a diffused-layer resistor in a CMOS process wherein the technique of creating a diffused-layer resistor is adopted, in addition to the effects described above, the second doping mask serves as a mask for creating high-concentration diffused layers on part of the region reserved for the creation of the diffused-layer resistor and on the region reserved for the creation of the first conduction-type MOS transistor. On the top of that, since a silicide creating mask is created with the second doping mask used as an etching mask, the silicide creating mask can be created without increasing the number of lithography processes.

In the method of creating a diffused-layer resistor in the course of creating a diffued layer fetching substrate, the same effects as those of the method of creating the diffused-layer resistor exist. In addition, the doping mask serves as a mask for creating high-concentration diffused layers on part of the region reserved for the creation of the diffused-layer resistor and on the region reserved for the creation of the first conduction-type MOS transistor. On the top of that, since a silicide creating mask is created with the second doping mask used as an etching mask, the silicide creating mask can be created without increasing the number of lithography processes.

DETAILED DESCRIPTION OF THE PREFERRED EMBODIMENTS

The present invention will become apparent from the following detailed description of preferred embodiments with reference to accompanying diagrams.

A first embodiment provided by the present invention is explained by referring to FIG. 2, diagrams showing processes for creating a diffused-layer resistor.

Figure 1A:
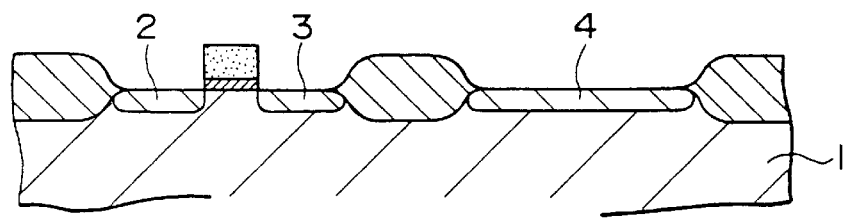
FIGS. 1A to 1C are diagrams showing processes of the related art for creating MOS transistors.
Figure 1B:
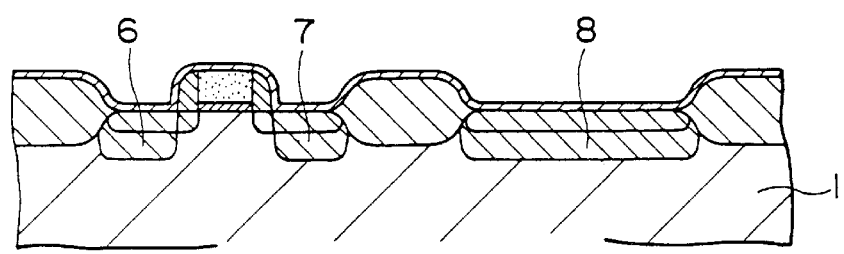
Figure 1C:
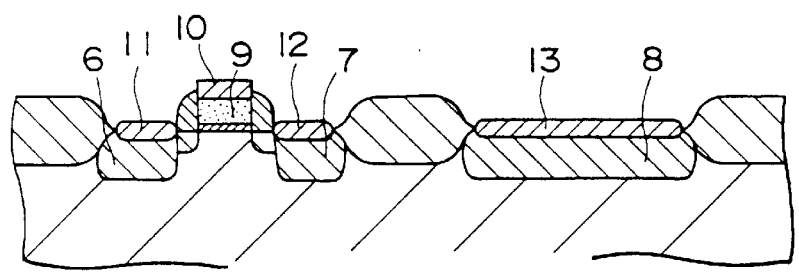
Figure 2A:
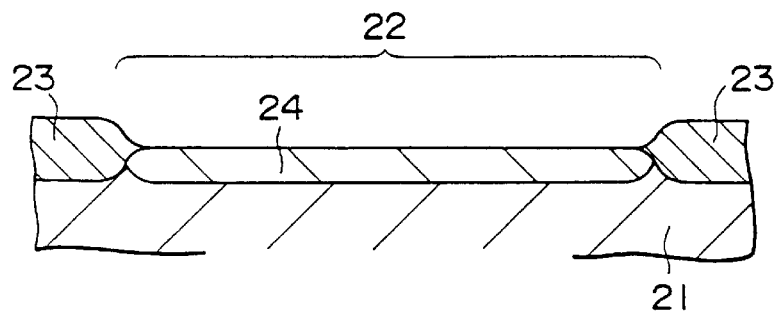
FIGS. 2A to 2D are diagrams showing a first embodiment implementing processes for creating diffused-layer resistors in accordance with the present invention.

First of all, element separating regions 23 for dividing a region 22 reserved for the creation of a diffused-layer resistor are created on a semiconductor substrate 21 using typically a LOCOS oxidation technique as shown in FIG. 2A. Typically, the semiconductor substrate 21 is a silicon substrate whereas the film of the element separating regions 23 is a silicon oxide film having a typical thickness of about 400 nm.

Later on, a first process is performed. In this process, a low-concentration diffused layer 24 is created on the region 22 reserved for the creation of a diffused-layer resistor on the semiconductor substrate 21 by using, typically, an ion implantation technique. As conditions of the ion implantation technique described above, phosphor ions ($P^+$) are used as impurities and the implanting energy and the dose quantity are set at 30 keV and 30 T (tera) pieces/$cm^2$ respectively.

Figure 2B:
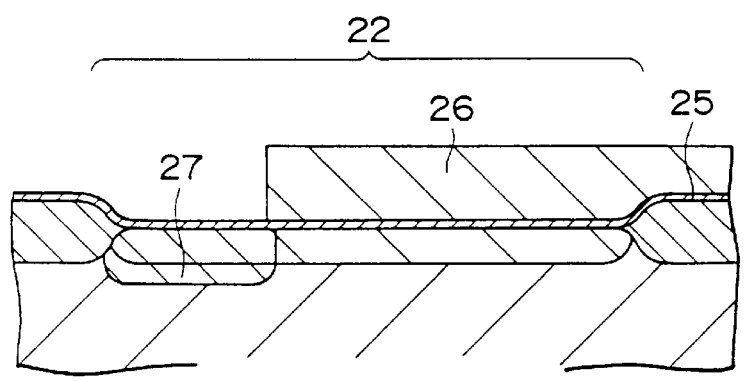

Subsequently, a second process shown in FIG. 2B is carried out. In this process, a mask creation film 25 with a typical thickness of 20 nm is created of a silicon oxide material on the surface of the semiconductor substrate 21 by using typically a CVD technique. After that, a resist film, which is not shown in the figure, is created on the semiconductor substrate 21 by using a coating technique. Then, a doping mask 26 is created from the resist film by using a lithography technique. The doping mask 26 covers part of the region 22 reserved for the creation of the diffused-layer resistor.

Subsequently, a third process is carried out. In this process, impurity doping is performed by using typically the ion-implantation technique. As conditions of the ion-implantation technique described above, arsenic ions ($As^+$) are used as impurities and the implanting energy and the dose quantity are set at 50 keV and 3 P (peta) pieces/$cm^2$ respectively.

Then, impurities are implanted on the region 22 reserved for the creation of the diffused-layer resistor on the semiconductor substrate 21 except the part covered by the doping mask 26 through the mask creation film 25 to create a high-concentration diffused layer.

0020

Figure 2C:
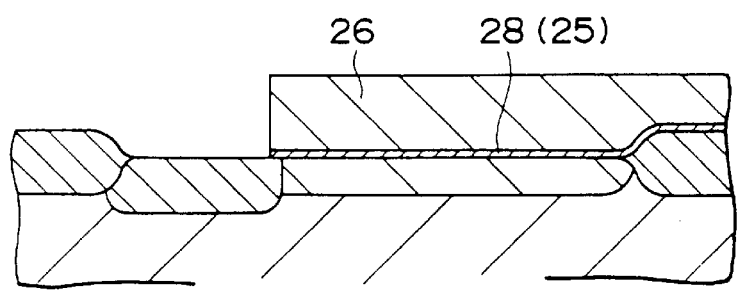

Subsequently, a fourth process shown in FIG. 2C is carried out. In this process, the mask creation film 25 is etched with the doping mask 26 used as an etching mask. Then, a silicide creating mask 28 is created from the mask creation film 25.

Later on, the doping mask 26 is removed by means of ashing or wet processing.

Figure 2D:
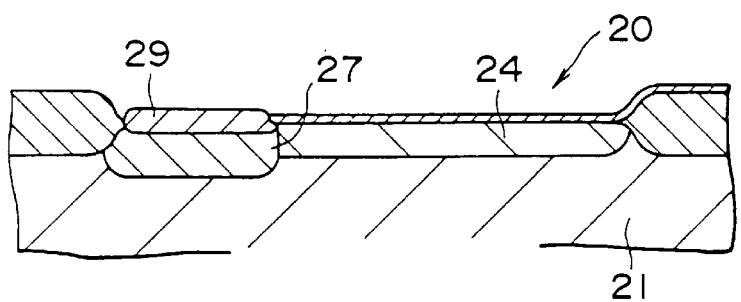

Subsequently, a layer of a metal having a high melting point is created on the upper side of the semiconductor substrate 21 by using a film creating technique such as sputtering, a CVD method or an evaporation method as shown in FIG. 2D. It should be noted that the metal layer itself is not shown in the figure. As shown in the figure, after the metal layer has been created, heat treatment for the silicide creating process is carried out to create a silicide layer 29 on the high-concentration diffused layer 27. Titan (Ti) is selected as the typical metal having a high melting point described above. In addition, the silicide creating thermal process described above is implemented through annealing at 650° C. for 30 seconds. Later on, the non-reacting layer of the metal having a high melting point is removed by the etching technique before carrying out again an annealing process at 800° C. for 30 seconds.

Then, a diffused-layer resistor 20 comprising the low-concentration diffused layer 24 and the high-concentration diffused layer 27 is activated. As a result, the low-concentration diffused layer 24 becomes a resistor having a typical resistance of about several hundreds of $\Omega/\square$.

In the first embodiment implementing the method for creating a diffused-layer resistor as described above, the doping mask 26 is created, covering part of the region 22 reserved for the creation of the diffused-layer resistor. Accordingly, the high-concentration diffused layer 27 is created only on some portions of the region 22 reserved for the creation of the diffused layer resistor. For this reason, the diffused-layer resistor 20 comprises the low-concentration diffused layer 24 and the high-concentration diffused layer 27. As a result, the resistance of the diffused-layer resistor 20 has a high value in comparison with that of the conventional resistor.

In addition, since the silicide creating mask 28 is created with the doping mask 26 for creating the high-concentration diffused layer 27 used as an etching mask, the silicide creating mask 28 can be created without increasing the number of mask processes.

On the top of that, the silicide creating mask 28 created as described above is used in the silicide creating process. Therefore, no silicide layer is created on the low-concentration diffused layer 24 covered by the silicide creating mask 28. Then, the silicide layer 29 is created on the high-concentration diffused layer 27. As a result, the silicide layer 29 is created not on the entire surface of the diffused-layer resistor 20, making the resistance of the diffused-layer resistor 20 not reduced by the silicide layer 29.

A second embodiment is explained next by referring to FIGS. 3A to 3F. The second embodiment implements a typical application of the method for creating a diffused-layer resistor, which is implemented by the first embodiment as described above, to a method for creating a diffused layer in a CMOS transistor process. In the figures, components identical with those employed in the first embodiment explained earlier are denoted by the same reference numerals.

Figure 3A:
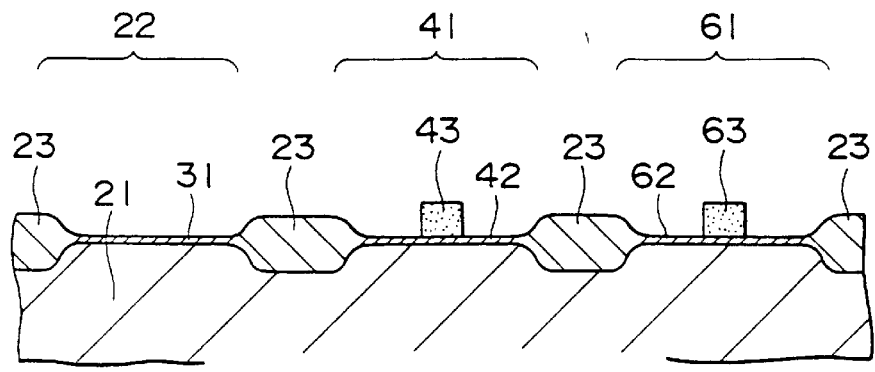
FIGS. 3A to 3F are diagrams showing a second embodiment implementing processes for creating MOS transistors and diffused-layer resistors in accordance with the present invention.

First of all, element separating regions 23 are created on a semiconductor substrate 21 by using typically a LOCOS oxidation technique which element separating regions 23 are used for separating a region 22 reserved for the creation of a diffused-layer resistor, a region 41 reserved for the creation of a first conduction-type MOS transistor of a CMOS transistor and a region 61 reserved for the creation of a second conduction-type MOS transistor of the CMOS transistor from each other as shown in FIG. 3A. It should be noted that the regions 41 and 61 are referred to hereafter simply as a first region and a second region respectively. The semiconductor substrate 21 described above is typically a silicon substrate whereas the film of the element separating regions 23 is a silicon oxide film having a typical thickness of about 400 nm.

Subsequently, films used in the LOCOS oxidation on the first and second regions 41 and 61 as well as the region 22 reserved for the creation of the diffused-layer resistor are removed by the etching technique. Examples of the films are an oxide film and nitride film which are both not shown in the figure.

Later on, by using a thermal oxidation process, gate insulating films 42 and 62 are created on outer layers of the semiconductor substrate 21 on the regions 41 and 61 respectively. The gate insulation films 42 and 62 are each an oxide silicon film having a typical thickness of about 16 nm. In addition, in the thermal oxidation process, an oxide film 31 is created also on an outer layer of the semiconductor substrate 21 on the region 22 reserved for the creation of the diffused-layer resistor.

Subsequently, by means of a generally used technique for creating a gate electrode, a first gate electrode 43 and a second gate electrode 63 are created from a polycrystalline silicon material on the regions 41 and 61 respectively. Later on, oxidation is performed in a dry oxygen ($O_2$) atmosphere at 900° C. An oxide film created at that time is not shown in the figure though.

Figure 3B:
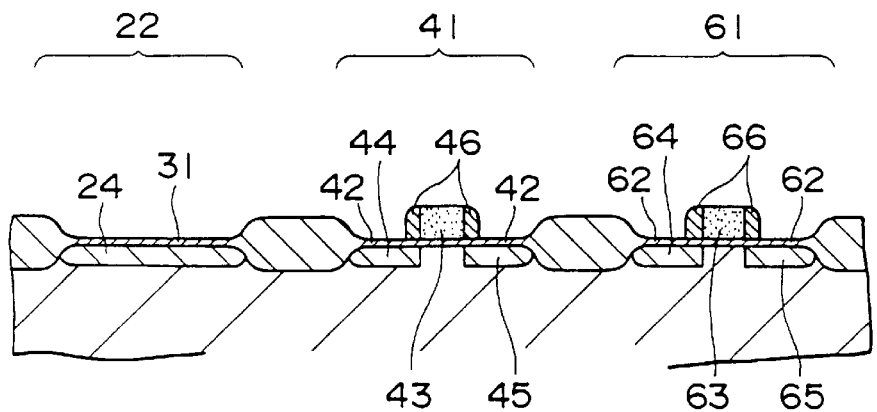

Subsequently, a first process shown in FIG. 3B is carried out. In this process, a low-concentration diffused layer 24 is created on the region 22 of the semiconductor substrate 21 reserved for the creation of the diffused-layer resistor by using typically the ion implantation technique. At the same time, low-concentration diffused layers 44 and 45 are created on the first region 41 of the semiconductor substrate 21 whereas low-concentration diffused layers 64 and 65 are created on the second region 61 of the semiconductor substrate 21. As conditions of the ion implantation technique described above, phosphor ions ($P^+$) are used as impurities and the implanting energy and the dose quantity are set at 30 keV and 30 T (tera) pieces/$cm^2$ respectively. The low-concentration diffused layers 44, 45, 64 and 65 created on the first and second regions 41 and 61 each serve as an LDD diffused layer.

Later on, side walls 46 and 66 are created from typically a silicon nitride film with a typical thickness of 150 nm on the sides of the first and second gate electrodes 43 and 63 respectively by using a technique for creating side walls wherein a created film is etched back.

Figure 3C:
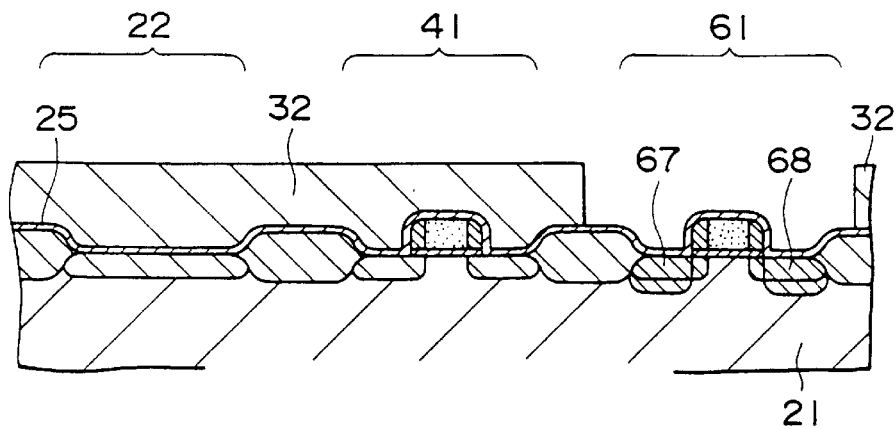

Subsequently, a second process shown in FIG. 3C is carried out. In this process, a mask creation film 25 is created from a silicon oxide material to give a typical thickness of 20 nm on the surface side of the semiconductor substrate 21 by using typically a CVD technique.

After that, a resist film, which is not shown in the figure, is created on the semiconductor substrate 21 by using a coating technique. Then, by using a lithography technique, first doping masks 32 are created from the resist film to cover the region 22 reserved for the creation of the diffused-layer resistor and the first region 41. Subsequently, by using the ion-implantation technique for impurity doping, high-concentration diffused layers 67 and 68 are created on the second region 61 to be used as source and drain regions. In the ion implantation technique, boron ions ($B^+$) or borodiflorine ($BF_2^+$) ions are typically used as impurities.

The mask creation film 25 on the second region 61 is then removed by means of an etching technique in which the first doping mask 32 is used as an etching mask. Later on, the first doping mask 32 is removed by means of ashing or wet processing.

Figure 3D:
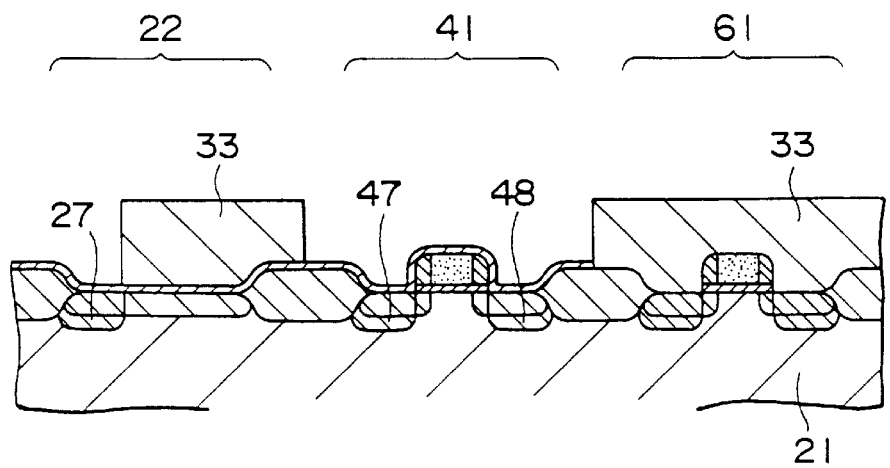

Furthermore, a resist film, which is not shown in the figure, is created on the semiconductor substrate 21 by using a coating technique as shown in FIG. 3D. Then, by using a lithography technique, a second doping mask 33 is created to cover part of the region 22 reserved for the creation of the diffused-layer resistor and the second region 61.

Subsequently, a third process is carried out. In this process, impurities are implanted on the semiconductor substrate 21 through the mask creation film 25 typically by using the ion implantation technique for impurity doping. Then, a high-concentration diffused layer 27 is created on the region 22 reserved for the creation of the diffused-layer resistor except the part covered by the second doping mask 33 and, at the same time, high-concentration layers 47 and 48 serving as source and drain regions are created on the semiconductor substrate 21 on both the sides of the first gate electrode 43 on the first region 41. As conditions of the ion implantation technique described above, arsenic ions (As$^+$) are used as impurities and the implanting energy and the dose quantity are set at 50 keV and 3 P (peta) pieces/cm$^2$ respectively.

Figure 3E:
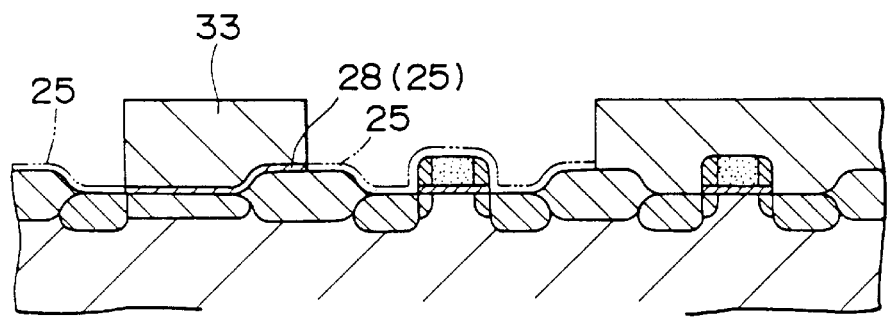

Subsequently, a fourth process shown in FIG. 3E is carried out. In this process, the mask creation film 25 is etched with the second doping mask 33 used as an etching mask. Then, the mask creation film 25 at a position denoted by a double-dotted line is removed. The remaining mask creation film 25 becomes a silicide creating mask 28.

Later on, the second doping mask 33 is removed by means of ashing or wet processing. Subsequently, an annealing process is carried out in a nitrogen (N$_2$) atmosphere at typically 900° C. for 20 minutes in order to activate the low-concentration layers 44, 45, 64 and 65 and the high-concentration layers 47, 48, 67 and 68 in the source and drain regions.

Figure 3F:
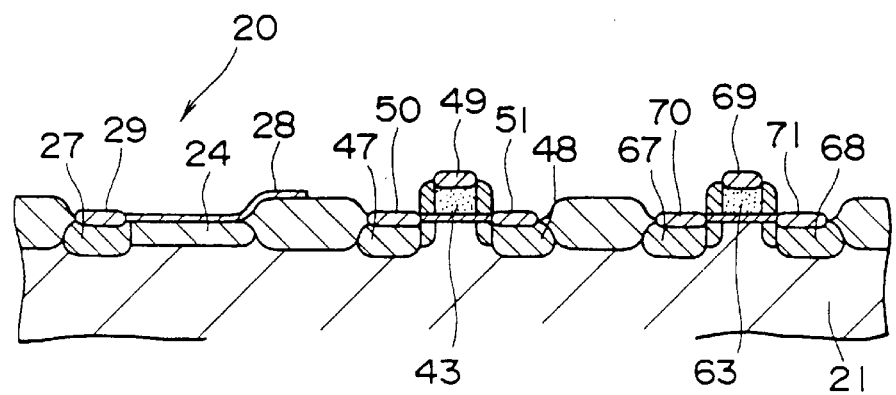

Subsequently, a layer of a metal having a high melting point is created on the upper side of the semiconductor substrate 21 by using a film creating technique such as sputtering, a CVD method or an evaporation method as shown in FIG. 3F. It should be noted that the metal layer itself is not shown in the figure. As shown in the figure, after the metal layer has been created, heat treatment for the silicide creating process is carried out to create a silicide layer 29 on the high-concentration diffused layer 27. At the same time, silicide layers 49 and 69 are created on the first and second gates 43 and 63 respectively whereas silicide layers 50, 51, 70 and 71 are created on the high-concentration layers 47, 48, 67 and 68 of the source and drain regions. A titan (Ti) film created by sputtering is typically selected as the metal having a high melting point described above. In addition, the silicide creating thermal process described above is implemented through annealing at 650° C. for 30 seconds. Later on, the non-reacting layer of the metal having a high melting point is removed by the etching technique before carrying out again an annealing process at 800° C. for 30 seconds. Then, the silicide layers 29, 49, 51, 69 and 71 are each activated.

In the processes described above, no silicide layer is created on the low-concentration diffused layer 24, allowing a resistor region having typically several hundreds of Ω/□ to be secured. As a result, the diffused-layer resistor 20 comprising the high-concentration diffused layer 27 and the low-concentration diffused layer 24 has a high resistance in comparison with the conventional one. In addition, the first conduction-type MOST transistor having a silicide structure is created on the first region 41 whereas the second conduction-type MOST transistor having a silicide structure is created on the second region 61. For this reason, the source and drain regions and the gate wire each have a low resistance of typically several Ω/□.

The technique of creating a diffused-layer resistor described above has the same effects as the first embodiment explained earlier. In addition, the second doping mask 33 serves as a mask for creating a high-concentration diffused layer on part of the region 22 reserved for the creation of a diffused-layer resistor as well as high-concentration diffused layers on the source and drain regions 47 and 48 of the second conduction-type MOS transistor. On the top of that, the silicide creating mask 28 is created by using the second doping mask 33 as an etching mask, allowing the silicide creating mask 28 to be created without increasing the number of lithography processes.

A third embodiment is explained next by referring to FIGS. 4A to 4D. The third embodiment implements a typical application of the method of creating a diffused-layer resistor, which is implemented by the first embodiment as described above, to a method of creating a diffued layer fetching substrate. In the figures, components identical with those employed in the first embodiment explained earlier are denoted by the same reference numerals.

Figure 4A:
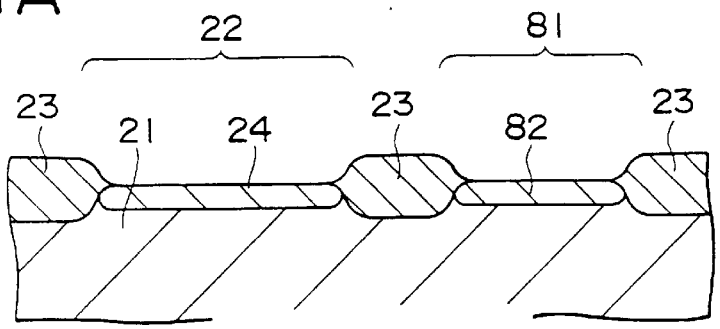
FIGS. 4A to 4D are diagrams showing a third embodiment implementing processes for creating diffused-layer resistors in accordance with the present invention.

First of all, element separating regions 23 are created on a semiconductor substrate 21 by using typically a LOCOS oxidation technique which element separating regions 23 are used for separating a region 22 reserved for the creation of a diffused-layer resistor and a fetching region 81 reserved for the creation of a diffued layer fetching substrate from each other as shown in FIG. 4A. The semiconductor substrate 21 described above is typically a silicon substrate whereas the film of the element separating regions 23 is a silicon oxide film having a typical thickness of about 400 nm.

Subsequently, films used in the LOCOS oxidation on the fetching region 81 as well as the region 22 reserved for the creation of the diffused-layer resistor are removed by the etching technique. Examples of the films are an oxide film and nitride film which are both not shown in the figure.

Subsequently, a first process is carried out. In this process, a low-concentration diffused layer 24 is created on the region 22 of the semiconductor substrate 21 reserved for the creation of the diffused-layer resistor by using typically the ion implantation technique. At the same time, a low-concentration diffused layer 82 is created on the fetching region 81 of the semiconductor substrate 21.

As conditions of the ion implantation technique described above, phosphor ions (P$^+$) are used as impurities and the implanting energy and the dose quantity are set at 30 keV and 30 T (tera) pieces/cm2 respectively.

Figure 4B:
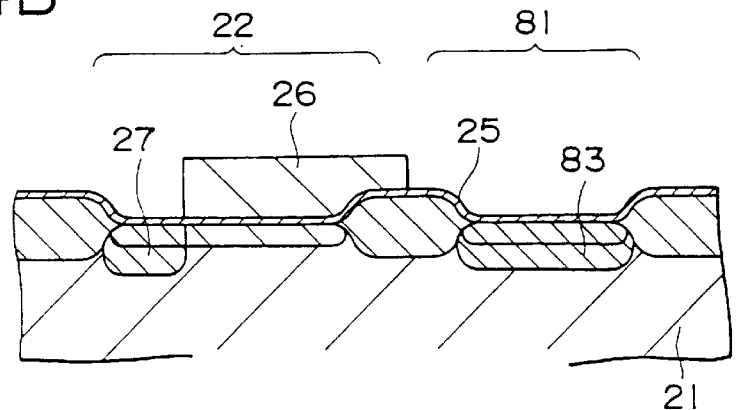

Subsequently, a second process shown in FIG. 4B is carried out. In this process, a mask creation film 25 is created from a silicon oxide material to give a typical thickness of 20 nm on the surface of the semiconductor substrate 21 by using typically a CVD technique. After that, a resist film, which is not shown in the figure, is created on the semiconductor substrate 21 by using a coating technique. Then, by using a lithography technique, a doping mask 26 is created from the resist film to cover part of the region 22 reserved for the creation of the diffused-layer resistor.

Subsequently, a third process is carried out. In this process, impurities are implanted on the semiconductor substrate 21 through the mask creation film 25 typically by using the ion implantation technique for impurity doping. A high-concentration diffused layer 27 is thereby created on the region 22 reserved for the creation of the diffused-layer resistor except the part covered by the doping mask 26 and, at the same time, a high-concentration layer 83 is also created on the fetching region 81 of the semiconductor substrate 21 by implanting impurities thereon through the mask creation film 25. As conditions of the ion implantation technique described above, arsenic ions (As$^+$) are used as impurities and the implanting energy and the dose quantity are set at 50 keV and 3 P (peta) pieces/cm$^2$ respectively.

Figure 4C:
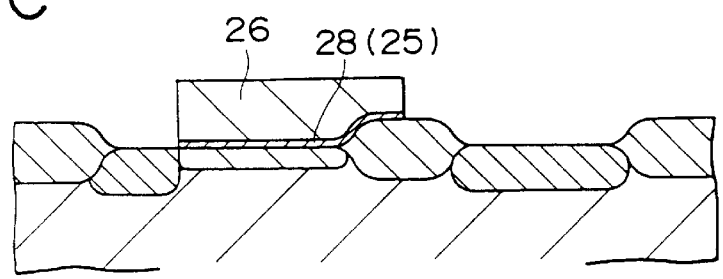

Subsequently, a fourth process shown in FIG. 4C is carried out. In this process, the mask creation film 25 is etched with the doping mask 26 used as an etching mask. Then, a silicide creating mask 28 is created from the mask creation film 25.

Later on, the doping mask 26 is removed by means of ashing or wet processing.

Figure 4D:
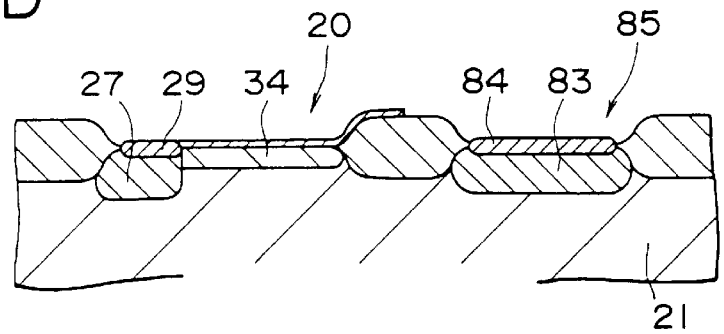

Subsequently, a layer of a metal having a high melting point is created on the upper side of the semiconductor substrate 21 by using a film creating technique such as sputtering, a CVD method or an evaporation method as shown in FIG. 4D. It should be noted that the metal layer itself is not shown in the figure. As shown in the figure, after the metal layer has been created, heat treatment for the silicide creating process is carried out to create silicide layers 29 and 84 on the high-concentration diffused layers 27 and 83 respectively. A titanium (Ti) film created by sputtering is selected as the typical metal having a high melting point described above. In addition, the silicide creating thermal process described above is implemented through annealing at 650° C. for 30 seconds. Later on, the non-reacting layer of the metal having a high melting point is removed by the etching technique before carrying out again an annealing process at 800° C. for 30 seconds. Then, the diffused-layer resistor 20 comprising the low-concentration diffused layer 24 and the high-concentration diffused layer 27 is activated. As a result, the diffused-layer resistor 20 has a high resistance since the resistance of the low-concentration diffused layer 24 is typically several hundreds of Ω/□. In addition, the high-concentration diffused layer 83 created on the fetching region 81 becomes a diffued layer fetching substrate 85.

The technique of creating a diffused-layer resistor in accordance with the third embodiment described above has the same effects as those of the technique of creating a diffused-layer resistor in accordance with the first embodiment explained earlier. At the same time, the doping mask 26 serves as a mask for creating the high-concentration diffused layer 17 on part of the region 22 reserved for the creation of the diffused-layer resistor as well as the high-concentration diffused layer 83 on the fetching region 81. On the top of that, since the silicide creating mask 28 is created with the doping mask 26 serving as an etching mask, the silicide creating mask 28 can be created without increasing the number of lithography processes.

As described above, according to the present invention, a doping mask is created to cover part of a region reserved for the creation of a diffused-layer resistor. As a result, a high-concentration diffused layer is created only on portions of the region reserved for the creation of a diffused-layer resistor. For this reason, the resistance of the diffused-layer resistor can be increased by using the same dedicated region as that used for creating the conventional resistor.

In addition, since a silicide creating mask is created with a doping mask used as an etching mask, the silicide creating mask can be created without increasing the number of lithography processes. As a result, the process load is small.

On the top of that, since no silicide layer is created on the low-concentration layer covered by the silicide creating mask, the resistance of the diffused-layer resistor is not decreased by a silicide layer. For this reason, the high resistance of the diffused-layer resistor can be preserved.

In addition to the effects described above, the present invention also allows a second doping mask to be used as a mask for creating high-concentration diffused layers of a diffused-layer resistor and a first conduction-type MOS transistor. Accordingly, it is not necessary to increase the mask count and the number of lithography processes. As a result, only a process load about the same as that of the conventional process needs to be borne.

In addition to the effects described so far, the present invention allows a doping mask to be used as a mask for creating high-concentration layers of a diffused-layer resistor and a diffued layer fetching substrate. Accordingly, it is not necessary to increase the mask count and the number of lithography processes. As a result, only a process load about the same as that of the conventional process needs to be borne.

What is claimed is:

1. A method for creating a diffused-layer resistor wherein said method comprises:

a first process of creating a low-concentration diffused layer on a region on a semiconductor substrate which region is reserved for creation of said diffused-layer resistor;

a second process of creating a doping mask to cover part of said region reserved for creation of said diffused-layer resistor after creating a mask creation film on the surface of said semiconductor substrate;

a third process of creating a high-concentration diffused layer on said region reserved for creation of said diffused-layer resistor except part covered by said doping mask by means of an impurity doping process; and a fourth process of creating a silicide creating mask from said mask creation film by means of an etching technique using said doping mask as an etching mask, removing said doping mask and creating a silicide layer selectively on said high-concentration diffused layer.

2. A method for creating a diffused-layer resistor according to claim 1 wherein said doping mask is created from an insulating film.

3. A method for creating a diffused-layer resistor according to claim 2 wherein said insulating film is made of $SiO_2$.

4. A method for creating a diffused-layer resistor according to claim 1 wherein said high-concentration diffused layer is created by implanting arsenic ions using an ion-implantation technique.

5. A method for creating a diffused-layer resistor in a CMOS transistor process wherein said method comprises:

a first process of creating gate electrodes of first and second conductivity-type transistors of CMOS transistors on a semiconductor substrate through gate insulating films along with creating low-concentration diffused layers wherein each of said diffused layers is used as an LDD diffused layer and, at the same time, creating a low-concentration layer on a region on said semiconductor substrate reserved for creation of said diffused-layer resistor and, after that, creating a side wall on a side of each of said gate electrodes;

a second process of creating a mask creation film on said semiconductor substrate, subsequently, creating a first doping mask to cover a region reserved for creation of said first conduction-type MOS transistor and said region reserved for creation of said diffused-layer resistor, subsequently creating high-concentration diffused layers to be used as source and drain regions on a region reserved for creation of said second conduction-type MOS transistor by using an impurity doping technique and, after that, removing said mask creation film on said region reserved for creation of said second conduction-type MOS transistor by means of an etching technique using said first doping mask as an etching mask and, finally, creating a second doping mask to cover part of said region reserved for creation of said diffused-layer resistor and said region reserved for creation of said second conduction-type MOS transistor;

a third process of creating a high concentration diffused layer on said region reserved for creation of said diffused-layer resistor except said part covered by said second doping mask and, at the same time, creating high-concentration diffused layers to be used as source and drain regions on a region reserved for creation of said second conduction-type MOS transistor by using an impurity doping technique; and a fourth process of creating a silicide creating mask from said mask creation film by means of an etching technique using said second doping mask as an etching mask and then creating silicide layers selectively on said high-concentration diffused layers and on each of said gate electrodes by using said silicide creating mask.

6. A method for creating a diffused-layer resistor according to claim 5 wherein said first and second doping masks are created from an insulating film.

7. A method for creating a diffused-layer resistor according to claim 6 wherein said insulating film is made of $SiO_2$.

8. A method for creating a diffused-layer resistor according to claim 5 wherein said low-concentration diffused layers are created by implanting phosphor ions by means using an ion-implantation technique.

9. A method for creating a diffused-layer resistor in a process of creating a diffused-layer fetching substrate wherein said method comprises:

a first process of creating a low-concentration diffused layer on a region reserved for creation of said diffused-layer resistor and a region reserved for creation of said diffused-layer fetching substrate;

a second process of creating a doping mask to cover part of said region reserved for creation of said diffused-layer resistor after creating a mask creation film on the surface of said semiconductor substrate;

a third process of creating a high-concentration diffused layer on said region reserved for creation of said diffused-layer resistor except said part covered by said doping mask and said region reserved for creation of said diffused-layer fetching substrate using an impurity doping technique; and a fourth process of creating a silicide creating mask from said mask creation film by means of an etching technique using said doping mask as an etching mask, removing said doping mask and creating a silicide layer selectively on said high-concentration diffused layer.

10. A method for creating a diffused-layer resistor in a process of creating a diffused-layer resistor according to claim 9 wherein said low-concentration diffused layers are created by implanting phosphor ions using an ion-implantation technique and said high-concentration diffused layers are created by implanting arsenic ions using said ion-implantation technique.

* * * * *